(12) United States Patent
Berlin et al.

(10) Patent No.: US 7,586,444 B2
(45) Date of Patent: Sep. 8, 2009

(54) HIGH-FREQUENCY ELECTROMAGNETIC BANDGAP DEVICE AND METHOD FOR MAKING SAME

(75) Inventors: Carl W. Berlin, West Lafayette, IN (US); Deepukumar M. Nair, Peru, IN (US)

(73) Assignee: Delphi Technologies, Inc., Troy, MI (US)

( * ) Notice: Subject to any disclaimer, the term of this patent is extended or adjusted under 35 U.S.C. 154(b) by 224 days.

(21) Appl. No.: 11/633,769

(22) Filed: Dec. 5, 2006

(65) Prior Publication Data

US 2008/0129645 A1 Jun. 5, 2008

(51) Int. Cl.
*H01Q 1/38* (2006.01)
*H01Q 15/02* (2006.01)

(52) U.S. Cl. .............................. 343/700 MS; 343/909; 343/762; 343/771

(58) Field of Classification Search .......... 343/700 MS, 343/909
See application file for complete search history.

(56) References Cited

U.S. PATENT DOCUMENTS

| | | | | |
|---|---|---|---|---|
| 6,552,696 | B1 * | 4/2003 | Sievenpiper et al. | 343/909 |
| 7,136,029 | B2 * | 11/2006 | Ramprasad et al. | 343/909 |
| 7,142,165 | B2 * | 11/2006 | Sanchez et al. | 343/771 |
| 2003/0011522 | A1 * | 1/2003 | McKinzie et al. | 343/700 MS |
| 2003/0020567 | A1 | 1/2003 | Chappell et al. | |
| 2006/0125713 | A1 * | 6/2006 | Thevenot et al. | 343/909 |
| 2007/0224737 | A1 * | 9/2007 | Berlin et al. | 438/141 |
| 2007/0285336 | A1 * | 12/2007 | Kamgaing | 343/895 |

OTHER PUBLICATIONS

European Search Report dated Jun. 9, 2008.
Chappell W J et al: "High Q two dimensional defect resonators—measured and simulated" Microwave Symposium Digest. 2000 IEEE MTT-S International Boston, MA, USA, Jun. 11-16, 2000, Piscataway, NJ, USA, IEEE, US, vol. 3, Jun. 11, 2000, pp. 1437-1440, XP010507124 ISBN: 0-7803-5687-X.

* cited by examiner

*Primary Examiner*—Trinh V Dinh
(74) *Attorney, Agent, or Firm*—Jimmy L. Funke

(57) ABSTRACT

A high-frequency Electromagnetic Bandgap (EBG) device, and a method for making the device are provided. The device includes a first substrate including multiple conducting vias forming a periodic lattice. The vias of the first substrate extend from the lower surface of the first substrate to the upper surface of the first substrate. The device also includes a second substrate having multiple conducting vias forming a periodic lattice. The vias of the second substrate extend from the lower surface of the second substrate to the upper surface of the second substrate. The second substrate is positioned adjacent to, and overlapping, the first substrate, such that the lower surface of the second substrate is in contact with the upper surface of the first substrate, and such that a plurality of vias of the second substrate are in contact with a corresponding plurality of vias of the first substrate.

16 Claims, 5 Drawing Sheets

HIGH-FREQUENCY ELECTROMAGNETIC BANDGAP DEVICE AND METHOD FOR MAKING SAME

TECHNICAL FIELD

The present invention generally relates to Electromagnetic Bandgap (EBG) devices, and more particularly, to EBG devices having high bandgap and resonant frequencies.

BACKGROUND OF THE INVENTION

EBG devices are devices generally having an ability to suppress and filter electromagnetic energy. EBG devices are often used to help suppress switching noise and electromagnetic radiation in printed circuit boards (PCBs) and packages containing electronic devices. Such devices are also sometimes used to improve the performance of planar antennas by reducing cross-coupling between antenna array elements through surface waves, and by suppressing and directing radiation. EBG devices can be useful in other active and passive devices and applications such as oscillators, waveguides, transmission lines, amplifiers, filters, power combining circuits, phased arrays, mixers, and microwave components and devices.

A typical EBG device generally has a periodic structure, such as for example, a lattice, that is made up of periodic perturbations. These periodic perturbations, also known as vias, can take the form of holes or dielectric or metal rods or posts. Often an EBG device takes the form of a uniform substrate material with metal on both sides creating a parallel plate. The substrate between the parallel plates is typically loaded with metal or dielectric rods or patches that form the periodic perturbations.

FIG. 1A provides an example of a conventional EBG device 50 located in a printed circuit board (PCB) 62. FIG. 1B provides an enlarged view of the EBG device 50. As shown, EBG device 50 has a dielectric layer 52 positioned between two ground planes 54 and 54a. Embedded in dielectric layer 52 are conductive vias 56 in a regular periodic pattern. Conductive vias 56 are typically formed from metal or a metal alloy. EBG device 50 is also shown having a coplanar waveguide input 58, and a coplanar waveguide output 60. In operation, the periodic pattern of conductive vias 56 acts to filter the coplanar waveguide input 58 before the signal is output at the coplanar waveguide output 60.

A typical EBG device 50 functions to block or suppress the propagation of electromagnetic radiation that falls within a certain defined frequency band known as a stopband or bandgap. The EBG device 50 can be characterized by its stopband/bandgap characteristics. These can include the width of the stopband/bandgap and the location in the frequency spectrum of the stopband/bandgap. For a given EBG device 50, the characteristics of the stopband/bandgap are generally determined by the physical characteristics and location of the periodic perturbations or conductive vias 56 in the device. The overall effect of the conductive vias 56 in an EBG device 50 is to create a filter that blocks electromagnetic energy in a certain frequency range from propagating in the substrate and on the surface of the substrate. Characteristics of the perturbations, or conductive vias 56, that can determine the bandgap characteristics include the spacing of the perturbations, the size of the perturbations, and the material used to create the perturbations. By choosing certain materials, sizes, and locations, the width and frequency location of the bandgap can be selected. FIG. 1C generally illustrates the transmission characteristics associated with the conventional EBG device 50. As can be seen, the conventional EBG device 50 will typically pass certain frequency ranges (those above and below the bandgap), and will attenuate frequencies that fall within the bandgap. As seen in FIG. 1C, the bandgap is bounded on the high end by an upper bandgap frequency above which signals are not significantly attenuated.

Conventional EBG devices discussed above can also be formed to allow some frequencies of electromagnetic energy within the bandgap to propagate. This is commonly accomplished by including defects, called defect resonators, in the EBG structure when it is manufactured. These defect resonators are interruptions or defects in the symmetry of the otherwise regular pattern of periodic perturbations 56 in the EBG device 50. For example, in an EBG device 50 including a periodic pattern of perturbations that are conductive vias 56, a defect could be formed by not including one of the conductive vias in the periodic pattern when the EBG device is manufactured. In another example involving a single substrate plane with a periodic pattern of via apertures filled with a dielectric material, a defect could be formed by not filling one of the via apertures.

In operation, a defect resonator in an EBG device 50 typically creates an area of resonance in the EBG device 50 by localizing energy within the structure, allowing transmission of a narrow frequency within the stopband or bandgap of the EBG device 50. In effect, an EBG device 50 formed with a defect resonator typically acts as a high-Q filter, suppressing frequencies within the bandgap except for those resonated by defects. FIG. 1D provides a general illustration of the frequency characteristics of the conventional EBG device 50 having a defect resonator. As can be seen, an EBG device 50 having a defect resonator will typically allow some frequencies within the bandgap to pass through the EBG device without being significantly attenuated. The frequencies within the bandgap at which signals pass through the EBG device 50 having a defect resonator without being significantly attenuated are referred to as resonant frequencies.

Although characteristics of EBG devices with and without defect resonators can be selected prior to the manufacturing of the structures, manufacturing process imprecision, process tolerance limitations, and manufacturing cost tradeoffs can make it difficult to manufacture EBG devices having high upper band gap frequencies and high resonant frequencies to provide for desired performance in high-frequency applications. It is therefore desirable to provide for a bandgap devices, and methods for producing such devices, that can achieve higher upper bandgap frequencies and resonant frequencies without requiring the use of atypical, expensive manufacturing processes.

SUMMARY OF THE INVENTION

In accordance with one aspect of the present invention, a high-frequency Electromagnetic Bandgap (EBG) device is provided. The device includes a first substrate including multiple conducting vias forming a periodic lattice in the first substrate. The vias of the first substrate extend from the lower surface of the first substrate to the upper surface of the first substrate. The device also includes a second substrate having multiple conducting vias forming a periodic lattice in the second substrate. The vias of the second substrate extend from the lower surface of the second substrate to the upper surface of the second substrate. The second substrate is positioned adjacent to, and overlapping, the first substrate, such that the lower surface of the second substrate is in contact with the upper surface of the first substrate, and such that a plurality of vias of the second substrate are in contact with a corresponding plurality of vias of the first substrate.

According to another aspect of the present invention, a high-frequency Electromagnetic Bandgap (EBG) device is provided. The device includes a first substrate made of material including a low-temperature co-fired ceramic. The first substrate includes a periodic lattice of conducting rods having a first diameter. The rods extend from the lower surface of the first substrate to the upper surface of the first substrate. The device also includes a second substrate made of material including low-temperature co-fired ceramic. The second substrate includes a periodic lattice of conducting rods having a second diameter. The rods extend from the lower surface of the second substrate to the upper surface of the second substrate. The second substrate is positioned adjacent to, and overlapping, the first substrate, such that the lower surface of the second substrate is in contact with the upper surface of the first substrate. The location of the conducting rods in the first substrate corresponds to the location of the conducting rods in the second substrate. Lower exposed surfaces of the conducting rods of the second substrate are in contact with upper exposed surfaces of the conducting rods of the first substrate. A ground plane at least partially covers the upper surface of the second substrate, and is in contact with upper exposed surfaces of the conducting rods of the second substrate.

In accordance with yet another aspect of the present invention, a method for fabricating an Electromagnetic Bandgap (EBG) device is provided. The method includes the steps of providing a first substrate and arranging a periodic lattice of conducting vias in the first substrate such that the vias of the first substrate have upper surfaces having a first cross-sectional area exposed on the upper surface of the first substrate. The method further includes the steps of providing a second substrate and arranging a periodic lattice of conducting vias in the second substrate such that the location of the vias of the second substrate correspond to the location of vias in the first substrate, and such that the vias of the second substrate have lower surfaces having a second cross-sectional area exposed on the lower surface of the second substrate. The method further includes the step of positioning the second substrate adjacent the first substrate such that the lower surface of the second substrate overlaps the upper surface of the first substrate, and such that lower surfaces of the vias of the second substrate are in contact with upper surfaces of corresponding vias of the first substrate. The conducting vias of the first and second substrates are formed such that the second cross-sectional area is less than the first cross-sectional area.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1A:
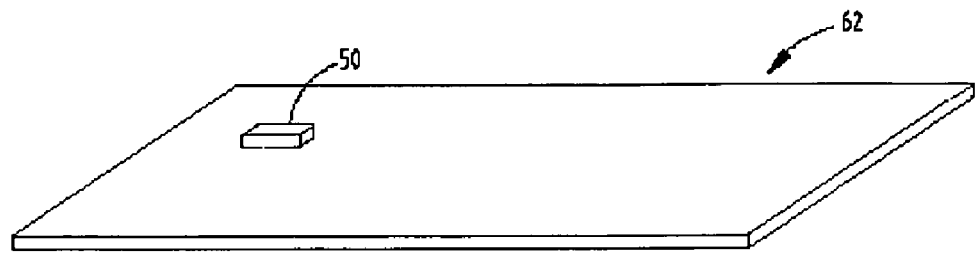
FIG. 1A is a perspective view illustrating a conventional Electromagnetic Bandgap device on a circuit board substrate.
Figure 1B:
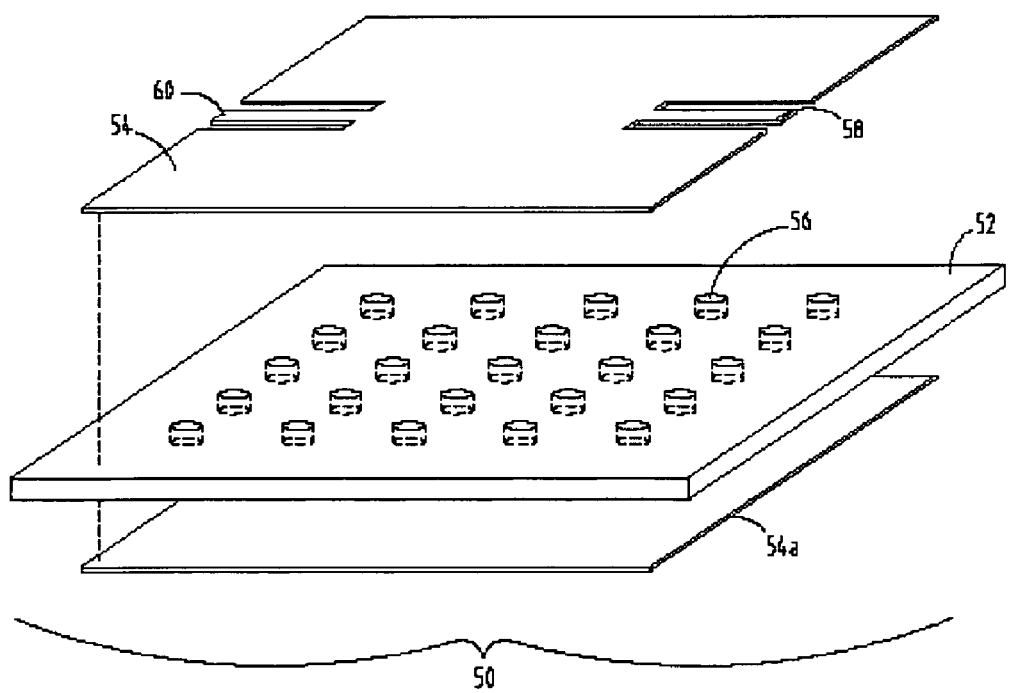
FIG. 1B is an enlarged exploded view of the conventional Electromagnetic Bandgap device.
Figure 1C:
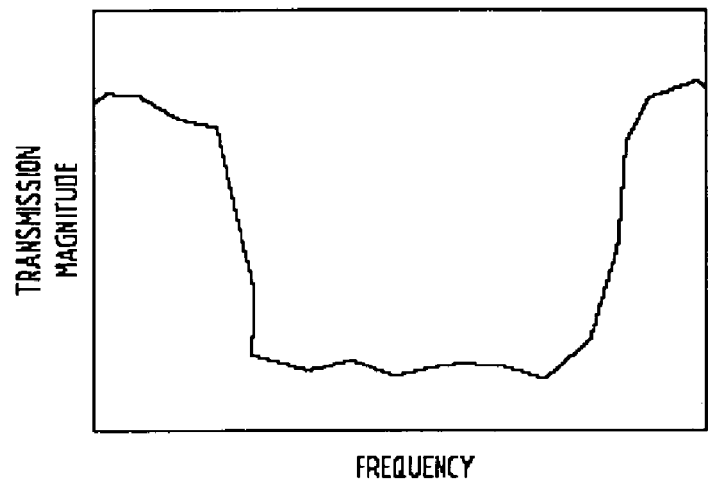
FIG. 1C is a waveform diagram illustrating a bandgap associated with the Electromagnetic Bandgap device shown in FIG. 1B.
Figure 1D:
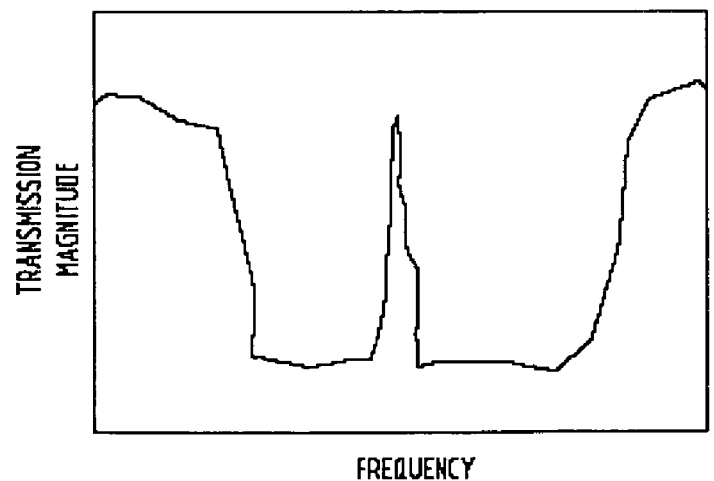
FIG. 1D is a waveform diagram illustrating a bandgap and resonant frequency associated with an Electromagnetic Bandgap device of FIG. 1B having a defect resonator.
Figure 2:
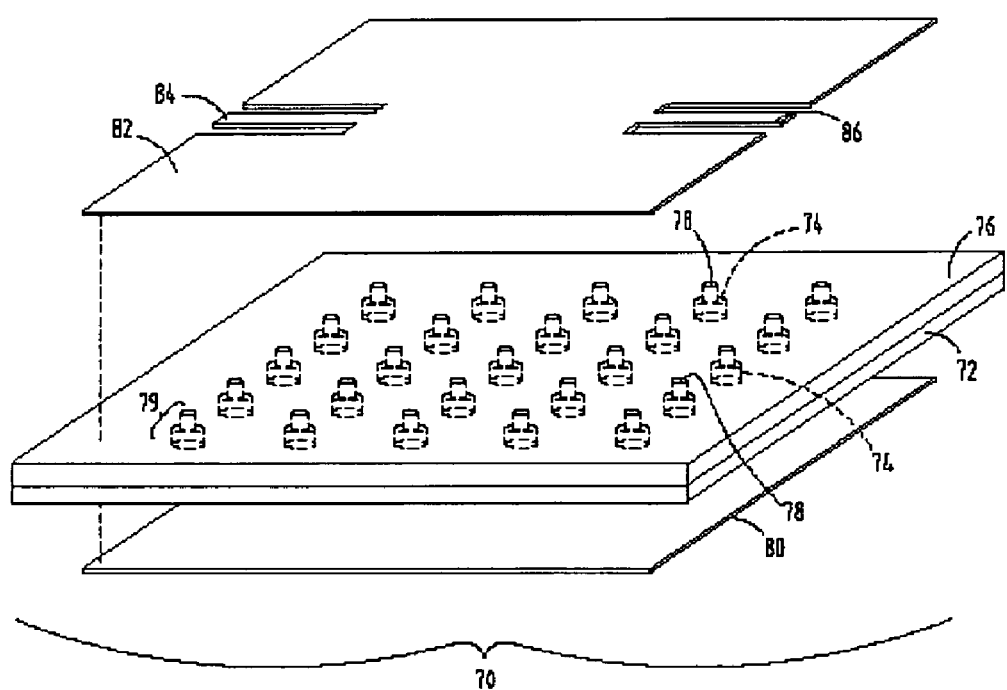
FIG. 2 is a perspective view illustrating an Electromagnetic Bandgap device according to a first embodiment of the present invention.

Referring to FIG. 2, an Electromagnetic Bandgap (EBG) device 70 is shown including a first planar substrate 72. As shown, first planar substrate 72 includes a periodic lattice of vias 74 embedded in first planar substrate 72. In the present embodiment, first planar substrate 72 is made of low-temperature co-fired ceramic (LTCC), and the periodic lattice of vias 74 are conductive vias formed in the shape of columns or rods. First planar substrate 72 has a lower surface and an upper surface, and conductive vias 74, formed in first planar substrate 72, extend from the lower surface of first planar substrate 72 to the upper surface of first planar substrate 72. More specifically, lower surfaces of the conducting vias 74 are exposed on the lower surface of first planar substrate 72, and upper surfaces of conductive vias 74 are exposed on the upper surface of first planar substrate 72. As shown, the conductive vias 74 are in the form of cylindrical columns that have a height equal to the thickness of first planar substrate 72 and a diameter. It should be appreciated that because in the present embodiment the conductive vias 74 are in the shape of columns that the exposed upper surfaces and lower surfaces of the conductive vias 74 take the form of circles in the upper and lower surfaces, respectively, of first planar substrate 72.

In alternate embodiments, first planar substrate 72 may be formed from FR4, or other materials used to form printed circuit boards (PCBs), or from other dielectric material. It should also be appreciated that in alternate embodiments, the conductive vias 74 formed in first planar substrate 72 may be in shapes other than columns or rods, and may be formed of material other than conducting material, such as, for example, a dielectric material.

EBG device 70 is also shown including a second planar substrate 76 that includes a periodic lattice of vias 78 formed within the second planar substrate 76. As shown, the vias 78 extend from the lower surface of the second planar substrate 76 through second planar substrate 76 to the upper surface of second planar substrate 76. It should be appreciated that both the upper and lower surfaces of the vias 78 are exposed on the upper and lower surfaces, respectively, of second planar substrate 76.

In the present embodiment, second planar substrate 76 is formed of LTCC, and the vias 78 are formed of a conducting material, such as, for example, a metal or metal alloy, and are in the form of cylindrical columns or rods extending from the lower surface of second planar substrate 76 to the upper surface of second planar substrate 76. In the present embodiment, the conductive columns 78 have a height equal to the thickness of second planar substrate 76 and have a diameter. It should be appreciated that because in the present embodiment the conductive vias 78 are in the shape of columns or rods, that the exposed upper and lower surfaces of the conductive vias 78 take the form of circles in the upper and lower surfaces, respectively, of second planar substrate 76. As shown in FIG. 2, the diameter of the conductive columns 78, formed in second planar substrate 76, and therefore the diameter of the exposed upper and lower surfaces of the conductive columns 78, is less than the diameter of the conductive columns 74 formed in first planar substrate 72, and is therefore also less than the diameter of the exposed upper and lower surfaces of the conductive columns 74. In an alternate embodiment, the total area in second planar substrate 76 occupied by each of the conductive volumes 78 is less than the total area in first planar substrate 72 occupied by each of the corresponding conductive columns 74.

Although in the present embodiment, second planar substrate 76 is formed of LTCC, it should be appreciated that in alternate embodiments, second planar substrate 76 may be formed from FR4, or other materials used to form PCBs, or from other dielectric material. Although in the present embodiment, the vias 78 formed in second planar substrate 76 are columns or rods formed of conducting material, it should be appreciated that in alternate embodiments, vias 78 may have a shape other than a cylindrical column or rod shape, and may be formed from material other than material that is conducting, such as, for example, dielectric material. In embodiments in which the vias 74 and/or 78 have shapes other than cylindrical columns or rods, the width and/or surface area of the surfaces of vias 78 exposed on the surface of substrate 76 is less than the width and or surface area of the surfaces of vias 74 exposed on the surface of substrate 72.

Continuing with FIG. 2, the periodic lattice of conductive vias 78 formed in the second planar substrate 76 has the same period and spacing as the periodic lattice of conductive vias 74 formed in the first planar substrate 72. In other words, the periodic lattice of conductive vias 78 and 74 formed in the second planar substrate 76 and in the first planar substrate 72, respectively, are formed such that when first planar substrate 72 and second planar substrate 76 are positioned properly with respect to each other, the conductive vias 78 and 74 formed in the first planar substrate 72 and the second planar substrate 76, respectively, overlap, and are in contact with, each other.

As shown in FIG. 2, second planar substrate 76 is positioned adjacent to first planar substrate 72, such that the lower surface of second planar substrate 76 is in contact with the upper surface of first planar substrate 72. In addition, second planar substrate 76 is positioned relative to first planar substrate 72, such that the conductive vias 78 formed in second planar substrate 76 overlap with corresponding conductive vias 74 formed in first planar substrate 72. In addition, because the lower surface of second planar substrate 76 is adjacent to the upper surface of first planar substrate 72, and because the lower surfaces of conductive vias 78 are exposed in the lower surfaces of second planar substrate 76, and the upper surfaces of conductive vias 74 are exposed in the upper surfaces of first planar substrate 72, it should be appreciated that the lower surfaces of conductive vias 78 are in physical contact with the upper surfaces of conductive vias 74.

In the present embodiment, the overall result is a conductive path from the lower surfaces of the conductive vias 74 exposed on the lower surfaces of first planar substrate 72 through the conductive vias 74 exposed on the upper surface of first planar substrate 72, on to the upper surfaces of conductive vias 74 to the lower surfaces of conductive vias 78 exposed on the lower surfaces of second planar substrate 76, through conductive vias 78, and on to the exposed upper surfaces of the conductive vias 78 on the upper surface of second planar substrate 76.

The EBG device 70 also includes a lower ground plane 80 having upper and lower surfaces, and having its upper surface positioned adjacent to, and in contact with, the lower surface of first planar substrate 72. It should be appreciated that the lower exposed conductive surfaces of conductive vias 74 are in contact with the upper surface of lower ground plane 80. EBG device 70 further includes an upper ground plane 82 positioned adjacent to the upper surface of second planar substrate 76, such that the lower surface of upper ground plane 82 is in contact with the upper surface of second planar substrate 76 and the upper conducting surfaces of conductive vias 78 exposed in the upper surface of second planar substrate 76.

In the present embodiment, upper ground plane 82 also includes a coplanar waveguide formed in the upper ground plane 82, and having a coplanar waveguide input 84 and a coplanar waveguide output 86. Coplanar waveguide input 84 and coplanar waveguide output 86 are positioned, such that they are not in electrical contact with the upper surfaces of conductive vias 78. The resulting EBG device 70 will have a bandgap with respect to signals provided at the coplanar waveguide input 84. More specifically, frequencies of a signal provided at coplanar waveguide input 84 that fall within the frequency range of the bandgap of EBG device 70 will be attenuated as they pass through EBG device 70 from input 84 to output 86.

As shown in FIG. 2, the resulting EBG device 70 has a periodic matrix of stacked conductive vias 79 formed of upper conductive vias 78 formed in second planar substrate 76 and stacked on top of lower conductive vias 74 formed in first planar substrate 72. The upper conductive vias 78 of the stacked conductive via 79 have a diameter that is less than the diameter of the lower conductive vias 74 of the stacked conductive vias 79. Because the diameter of the conductive vias 78 is smaller than the diameter of the lower conductive vias 74, the stacked conductive vias 79 of EBG device 70 may be spaced closer together than typical conductive vias without having the upper exposed conducting surfaces of the upper conductive vias 78 in contact with the input 84 and/or output 86 of the coplanar waveguide formed in the upper ground plane 82. By allowing for less distance between the stacked conductive vias 79 formed in the EBG device 70, EBG device 70 is enabled to exhibit upper bandgap frequencies higher than conventional EBG devices.

Figure 3:
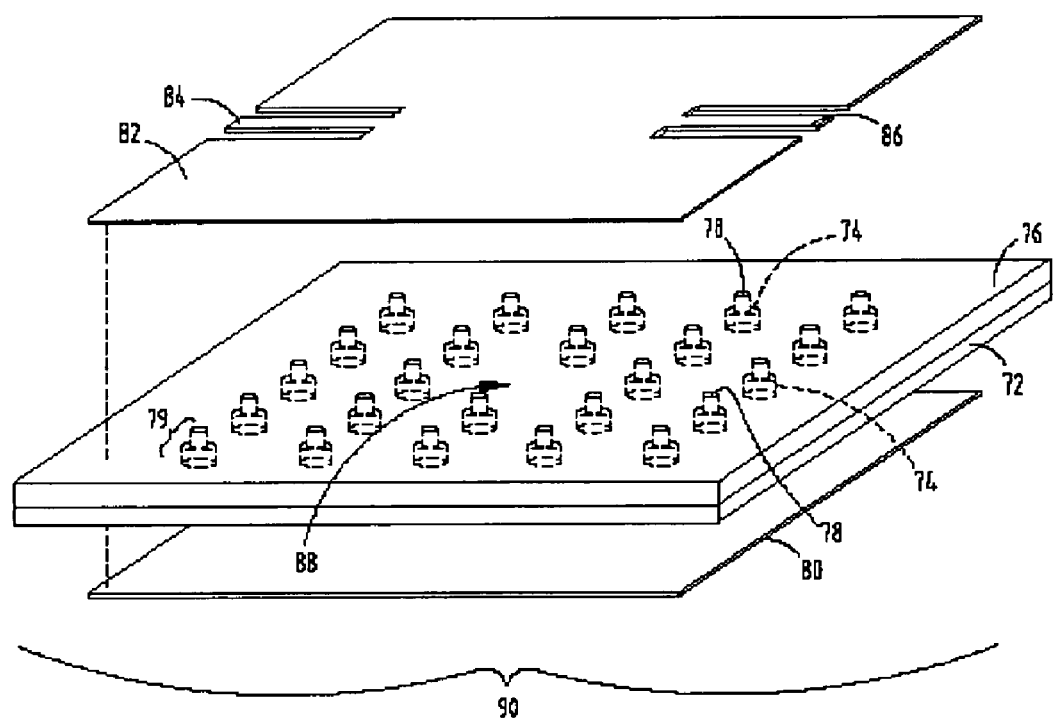
FIG. 3 is a perspective view illustrating an Electromagnetic Bandgap device including a defect resonator, according to a second embodiment of the present invention.

Referring to FIG. 3, an EBG device 90 having a defect resonator 88 is provided. The EBG device 90 generally illustrated in FIG. 3 is identical to the EBG device 70 of the embodiment of FIG. 2, with the exception that a defect resonator 88 is present in the EBG device 90. More specifically, as shown, the periodic lattice or matrix of conductive vias 74 formed in the first planar substrate 72 is interrupted by the absence of a conductive via 74 in the middle of the periodic matrix of conductive vias 74. In addition, the periodic matrix of conductive vias 78 formed in the second planar substrate 76 is interrupted by the absence of a conductive via 78 in the middle of the periodic matrix of conductive vias 78. Because the periodic lattice of vias formed in the first planar substrate 72 and second planar substrate 76 is interrupted by the absence of the vias noted above, the EBG device 90 exhibits a resonant frequency within the bandgap. The discontinuity in the periodic matrix of conductive vias is referred to as a defect resonator 88. The resonant frequency of EBG device 90 caused by defect resonator 88 is in part determined by the location and physical characteristics of the defect resonator 88. Because, as noted above with respect to the embodiment generally illustrated in FIG. 2, the conductive vias 78 and 74 formed in second planar substrate 76 and first planar substrate 72, respectively, may be located closer together because of the smaller diameter of the conductive vias 78, EBG device 90 can achieve a higher defect resonant frequency than typical EBG devices.

Although the defect resonator 88 of EBG device 90 in the present embodiment is formed by the absence of conductive vias 78 and 74 in both second planar substrate 76 and first planar substrate 72, respectively, it should be appreciated that in alternate embodiments, because a defect resonator 88 may be formed by changing the physical characteristics of the defect resonator 88 and/or the location of the defect resonator 88, EBG device 90 may have defect resonators 88 formed by a lack of conductive vias in either second planar substrate 76 or first planar substrate 72, or both second planar substrate 76 and first planar substrate 72. Multiple defect resonators 88 may also be formed by having multiple absences of conductive vias in the periodic matrices formed in second planar substrate 76 and/or first planar substrate 72. In addition, it should be appreciated that a defect resonator 88 may be formed by altering the shape and/or size of conductive vias formed in second planar substrate 76 and/or first planar substrate 72 relative to the shape and/or size of vias of regular, periodic matrices of vias formed in second planar substrate 76 and first planar substrate 72.

In one specific alternate embodiment, an EBG device 90 is formed with coplanar waveguide input 84 and coplanar waveguide output 86 each having a width of 4 mils, the spaces between coplanar waveguide input 84 and upper ground plane 82 having a width of 4 mils, and the spaces between output 86 and upper ground plane 82 having a width of 4 mils. In this alternate embodiment, the conductive rods 78 formed in the second planar substrate 76 have a diameter of 4 mils, and the conductive rods 74 formed in first planar substrate 72 have a diameter of 8 mils. In this embodiment, the EBG device 90 exhibits an upper bandgap of greater than approximately 76.5 GHz and a resonant frequency of greater than approximately 76.5 GHz.

In an yet another alternate embodiment of EBG device 90, the widths of coplanar waveguide input 84 and coplanar waveguide output 86, the spacing between coplanar waveguide input 84 and upper ground plane 82, the spacing between coplanar waveguide output 86 and upper ground plane 82, the diameter of conductive vias 78, and the diameter of conductive vias 74 are selected, such that the EBG device 90 exhibits a resonant frequency and upper bandgap of greater than approximately 65 GHz.

Figure 4:
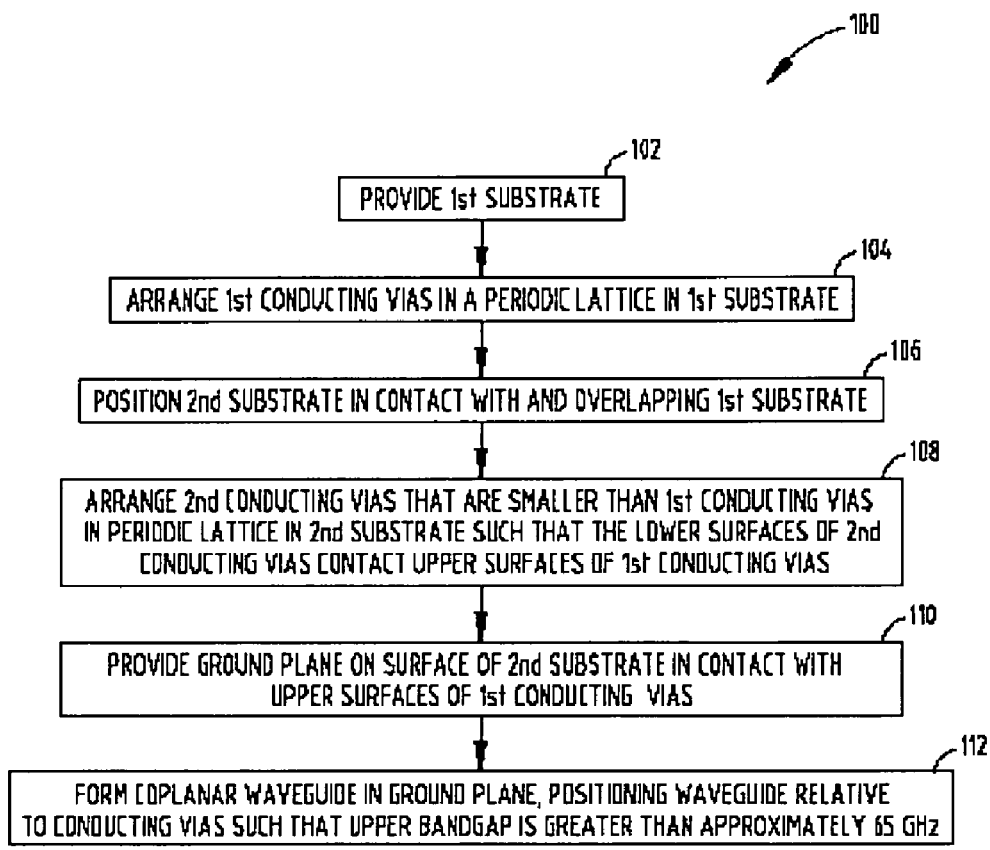
FIG. 4 is a flow diagram generally illustrating a method for making an Electromagnetic Bandgap device, according to one embodiment of the present invention.

Referring to FIG. 4, a method 100 for making a high-frequency EBG device is provided. In a first step 102 of the method, a first substrate is provided. In the present embodiment, the substrate is made of low-temperature co-fired ceramic. In an alternate embodiment, the substrate is made of FR4 or other materials used to fabricate printed circuit boards (PCBs), or other dielectric material. In a second step 104 of the method, conducting vias are arranged in the first substrate in a regular periodic matrix or lattice. In an alternate embodiment, the vias are made of a dielectric material. In still another alternate embodiment, the periodic matrix of vias is interrupted by at least one defect or discontinuity in the periodic matrix. In a third step 106 of the method, a second substrate is positioned such that it overlaps, and is in contact with, the first substrate. In the present embodiment, the second substrate is made of low-temperature co-fired ceramic. In an alternate embodiment, the substrate may be made of FR4 or other materials used to fabricate PCBs, or other dielectric material.

In a fourth step 108 of the method, conducting vias that are smaller than the conducting vias arranged in the first substrate are arranged in the second substrate in a regular periodic matrix or lattice. The vias and the second substrate are arranged such that the lower surfaces of the vias arranged in the second substrate overlap, and are in contact with, upper surfaces of the vias arranged in the first substrate. In an alternate embodiment, the vias are made of a dielectric material. In still another alternate embodiment, the periodic matrix of vias in the second substrate is interrupted by at least one defect or discontinuity in the periodic matrix. In still another alternate embodiment, both the first substrate and second substrate have discontinuities in their respective matrices of conductive vias, and the location of the discontinuities in the first substrate correspond to the location of discontinuities in the second substrate. In a fifth step 110 of the method, a ground plane is provided on the upper exposed surface of the second substrate such that the ground plane is in contact with exposed upper surfaces of the conducting vias of the second substrate. In a sixth step 112 of the method, a coplanar waveguide is formed in the ground plane and positioned relative to the conducting vias of the second substrate such that the upper bandgap of the resulting structure is greater than approximately 65 GHz. In an alternate embodiment in which discontinuities are present in either the first or second substrates, the coplanar waveguide is formed and positioned relative to the conductive vias of the substrates such that the resulting structure has a resonant frequency of greater than approximately 65 GHz.

As described above, the invention advantageously provides for EBG devices with resonant frequencies and upper bandgap frequencies of greater than 65 GHz without requiring the use of atypical and expensive processing method. The invention advantageously permits the spacing between vias and a periodic lattice of vias to be decreased to achieve higher resonant and upper bandgap frequencies without causing the periodic vias to interfere with the input and output of coplanar waveguides formed in the EBG device.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An Electromagnetic Bandgap (EBG) device, comprising: a first substantially planar substrate having an tipper surface and a lower surface; a plurality of discrete vias comprising conducting material and extending from said lower surface of said first substantially planar substrate through said first substantially planar substrate to said upper surface of said first substantially planar substrate, said plurality of discrete vias having conducting material exposed on said upper surface of said first substantially planar substrate, said plurality of discrete vias forming a periodic lattice in said first substantially planar substrate;

a second substantially planar substrate having an tipper surface and a lower surface, said second substantially planar substrate located adjacent to said first substantially planar substrate such that the lower surface of said second substantially planar substrate is in contact with the upper surface of said first substantially planar substrate; and a plurality of vias comprising conducting material and extending from said lower surface of said second substantially planar substrate through said second substantially planar substrate to said upper surface of said second substantially planar substrate, said plurality of said vias having conducting material exposed on said upper and lower surfaces of said second substantially planar substrate, said plurality of vias forming a periodic lattice in said second substantially planar substrate, wherein said first and second substantially planar substrates are aligned such that conducting material of the lower surfaces of a plurality of vias of said second substantially planar substrate is in contact with conducting material of the upper surfaces of a plurality of vias of said first substantially planar substrate, wherein said vias of said first substantially planar substrate have essentially the same shape and size, and wherein said vias of said second substantially planar substrate have essentially the same shape and size, and wherein the size of said vias of said first substantially planar substrate is greater than the size of said vias of said second substantially planar substrate;

a ground plane positioned on the upper surface of said second substantially planar substrate, said ground plane in contact with conducting material of the upper surfaces of the plurality of vias of said second substantially planar substrate; and a coplanar waveguide positioned in at least one of said second substantially planar substrate and said ground plane.

2. The Electromagnetic Bandgap (EBG) device of claim 1, wherein said vias of said first substantially planar substrate and said second substantially planar substrate comprise conducting rods approximately cylindrical in shape said conducting rods having lengths approximately perpendicular to the upper and lower surfaces of said first and second substantially planar substrates, said conducting rods having diameters, and wherein the diameter of the conducting rods of said first substantially planar substrate is greater than the diameter of the conducting rods of said second substantially planar substrate.

3. The Electromagnetic Bandgap (EBG) device of claim 2, wherein said coplanar waveguide is formed in said ground plane and positioned relative to said conducting rods such that the Electromagnetic Bandgap device has an upper bandgap frequency of greater than approximately 65 GHz.

4. The Electromagnetic Bandgap (EBG) device of claim 2, further comprising a defect in the periodic lattice of at least one of said first and second substantially planar substrates, said defect causing the Electromagnetic Bandgap (EBG) device to exhibit a resonant frequency, wherein said coplanar waveguide is formed in said ground plane and positioned relative to said conducting rods such that the resonant frequency is greater than approximately 65 GHz.

5. The Electromagnetic Bandgap (EBG) device of claim 2, wherein said first and second substantially planar substrates comprise dielectric material.

6. The Electromagnetic Bandgap (EBG) device of claim 5, wherein said first and second substantially planar substrates comprise low temperature co-fired ceramic.

7. An Electromagnetic Bandgap (EBG) device, comprising:
a first substantially planar substrate comprising low-temperature co-fired ceramic and having upper and lower surfaces;
a periodic lattice of conducting rods embedded in said first substantially planar substrate, said conducting rods extending from the lower surface of said first substantially planar substrate to the tipper surface of said first substantially planar substrate, said conducting rods having a first diameter;
a second substantially planar substrate comprising low temperature co-fired ceramic and having upper and lower surfaces, said second substantially planar substrate positioned adjacent said first substantially planar substrate such that the lower surface of said second substantially planar substrate is in contact with, and substantially overlaps, the upper surface of said first substantially planar substrate;
a periodic lattice of conducting rods embedded in said second substantially planar substrate, said conducting rods of the second substantially planar substrate extending from the lower surface of said second substantially planar substrate to the upper surface of said second substantially planar substrate, said conducting rods of the second substantially planar substrate having a second diameter; and
a ground plane at least partially covering the upper surface of said second substantially planar substrate, said ground plane in contact with exposed tipper surfaces of said conducting rods of the second substantially planar substrate, wherein the location of conducting rods of the second substantially planar substrate corresponds to the location of conducting rods of said first substantially planar substrate, such that lower exposed surfaces of said conducting rods of the second substantially planar substrate are in contact with upper exposed surfaces of said conducting rods of said first substantially planar substrate, and wherein the first diameter is greater than the second diameter.

8. The Electromagnetic Bandgap (EBG) device of claim 7, further comprising a coplanar waveguide formed in said ground plane and positioned relative to said conducting rods such that the Electromagnetic Bandgap device has an upper bandgap frequency of greater than approximately 65 GHz.

9. The Electromagnetic Bandgap (EBG) device of claim 8, further comprising a defect in the periodic lattice of at least one of said first and second substantially planar substrates, said defect causing the Electromagnetic Bandgap (EBG) device to exhibit a resonant frequency, wherein said coplanar waveguide is positioned relative to said conducting rods such that the resonant frequency is greater than approximately 65 GHz.

10. A method for fabricating an Electromagnetic Bandgap (EBG) device, comprising the steps of:
providing a first substantially planar substrate having upper and lower surfaces;
arranging conducting vias in the first substantially planar substrate in a periodic lattice, wherein the conducting vias extend from the bottom of the substrate to the top of the substrate, and wherein the conducting vias have upper surfaces exposed on the upper surface of the first substantially planar substrate, and wherein the upper surfaces have a first cross-sectional area;
positioning a second substantially planar substrate having upper and lower surfaces adjacent to the first substantially planar substrate such that the lower surface of the second substantially planar substrate overlaps the upper surface of the first substantially planar substrate; and
arranging conducting vias in the second substantially planar substrate in a periodic lattice, wherein the conducting vias extend from the bottom of the second substantially planar substrate to the top of the second substantially planar substrate, and wherein the conducting vias have upper surfaces exposed on the upper surface of the second substantially planar substrate and lower surfaces exposed on the lower surface of the second substantially planar substrate, and wherein the lower surfaces of the conducting vias of the second substantially planar substrate are in contact with the upper surfaces of the conducting vias of the first substantially planar substrate, and wherein the lower surfaces of the conducting vias of the second substantially planar substrate have a second cross-sectional area that is less than the first cross-sectional area.

11. The method of claim 10, further comprising the step of providing a ground plane on the upper surface of the second substantially planar substrate, such that the ground plane is in contact with upper surfaces of the conducting vias of the second substantially planar substrate.

12. The method of claim 11, further comprising the step of forming a coplanar waveguide in the ground plane, the coplanar waveguide positioned such that an upper band gap frequency of the Electromagnetic Bandgap (EBG) device is greater than approximately 65 GHz.

13. The method of claim 11, further comprising the step of creating a defect in the periodic lattice of at least one of the first and second substantially planar substrates, such that the Electromagnetic Bandgap (EBG) device exhibits a resonant frequency.

14. The method of claim 13, further comprising the step of positioning the coplanar waveguide such that the resonant frequency is greater than approximately 65 GHz.

15. The method of claim 14, wherein the first and second substantially planar substrates comprise low-temperature co-fired ceramic.

16. The method of claim 15 wherein the vias are rods having a cylindrical shape with a height and a diameter, and wherein the diameter of the rods of the first substantially planar substrate is greater than the diameter of the rods of the second substantially planar substrate

* * * * *